(12) United States Patent
Biskeborn et al.

(10) Patent No.: US 9,773,513 B2
(45) Date of Patent: Sep. 26, 2017

(54) HARDENING CHROMIUM OXIDE FILMS IN A MAGNETIC TAPE HEAD AND OTHER STRUCTURES

(71) Applicant: International Business Machines Corporation, Armonk, NY (US)

(72) Inventors: Robert G. Biskeborn, Hollister, CA (US); Calvin S. Lo, Saratoga, CA (US); Charles T. Rettner, San Jose, CA (US); Philip M. Rice, Morgan Hill, CA (US); Teya Topuria, San Jose, CA (US); Kumar R. Virwani, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 14/742,827

(22) Filed: Jun. 18, 2015

(65) Prior Publication Data

US 2016/0372142 A1    Dec. 22, 2016

(51) Int. Cl.
*B05D 3/00* (2006.01)
*B05D 3/06* (2006.01)
(Continued)

(52) U.S. Cl.
CPC .......... *G11B 5/3163* (2013.01); *C23C 14/582* (2013.01); *G11B 5/3106* (2013.01)

(58) Field of Classification Search
CPC ....... G11B 5/3163; G11B 5/3106; G11B 5/31; G11B 5/00813; G11B 5/06; C23C 14/5833; C23C 14/582
See application file for complete search history.

(56) References Cited

U.S. PATENT DOCUMENTS 8,611,043 B2 * 12/2013 Biskeborn .......... G11B 5/00821
                                                      360/110
8,724,434 B2 *  5/2014 Matsuzaki ............... G11B 5/62
                                                      360/131
(Continued)

FOREIGN PATENT DOCUMENTS

EP         0709735 A2    5/1996
EP         0872767 A2   10/1998
WO        03022564 A1    3/2003

OTHER PUBLICATIONS

Drory et al., "Deposition and characteristics of chromium nitride thin film coatings on precision balls for tribological applications", Surface and Coatings Technology 206 (2011), pp. 1983-1989, © 2011 Elsevier B.V., pp. 1-7, doi:10.1016/j.surfcoat.2011.08.048.
(Continued)

*Primary Examiner* — Michael Wieczorek
(74) *Attorney, Agent, or Firm* — Bryan D. Wells

(57) ABSTRACT

A chromium oxide film is formed at room temperature. The chromium oxide film has at least one partially polycrystalline portion and/or at least one amorphous portion depending upon the substrate(s) over which the chromium oxide film is formed. Partially polycrystalline portion(s) of the chromium oxide film are exposed, at room temperature, to an electron beam that has an accelerating voltage of at least 100 kilovolts to further crystallize the partially polycrystalline portion(s). Amorphous portion(s) of the chromium oxide film are exposed, at room temperature, to an electron beam that has an accelerating voltage of more than 100 kilovolts to crystallize the amorphous portion(s).

9 Claims, 17 Drawing Sheets

(51) Int. Cl.
C08J 7/18 (2006.01)
G11B 5/31 (2006.01)
C23C 14/58 (2006.01)

(56) References Cited

U.S. PATENT DOCUMENTS

| | | |
|---|---|---|
| 2003/0180670 A1 | 9/2003 | Hasegawa et al. |
| 2004/0262264 A1 | 12/2004 | Crawford et al. |
| 2006/0166041 A1 | 7/2006 | Takeda et al. |
| 2007/0225163 A1 | 9/2007 | Shimbo et al. |
| 2014/0087089 A1* | 3/2014 | Biskeborn ............ G11B 5/3163 427/552 |
| 2014/0147641 A1 | 5/2014 | Vermeulen |

OTHER PUBLICATIONS

Polychronopoulou et al., "Effect of Cu Content on the Structure, and Performance of Substoichiometric Cr—N Coatings", Tribol Lett (2010), pp. 57-68, Received: Apr. 16, 2009 / Accepted: Dec. 29, 2009 / Published online: Jan. 22, 2010, © Springer Science+Business Media, LLC 2010.

* cited by examiner

HARDENING CHROMIUM OXIDE FILMS IN A MAGNETIC TAPE HEAD AND OTHER STRUCTURES

BACKGROUND

The present invention relates to processing of thin films, and more particularly, this invention relates to methods for hardening chromium oxide films via crystallization thereof on devices such as magnetic heads.

In magnetic storage systems, data is read from and written onto magnetic recording media utilizing magnetic transducers commonly. Data is written on the magnetic recording media by positioning a magnetic recording transducer over the media where the data is to be stored. The magnetic recording transducer generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For both disk and tape storage systems, that goal has led to increasing the track and linear bit density on the recording medium, and decreasing the thickness of the magnetic medium. However, the development of small footprint, higher performance tape drive systems has created various problems in the design of a tape head assembly for use in such systems.

In a tape drive system, magnetic tape is moved over the surface of the tape head at high speed. Usually the tape head is designed to minimize the spacing between the head and the tape. The spacing between the magnetic head and the magnetic tape is crucial so that the recording gaps of the transducers, which are the source of the magnetic recording flux, are in near contact with the tape to effect writing sharp transitions, and so that the read element is in near contact with the tape to provide effective coupling of the magnetic field from the tape to the read element.

SUMMARY

According to one embodiment of the present disclosure, a method for hardening chromium oxide films is provided. The method includes forming, at room temperature, a chromium oxide film having a partially polycrystalline portion on a crystalline substrate; and exposing, at room temperature, the chromium oxide film to an electron beam having an accelerating voltage of at least 100 kilovolts to further crystallize the partially polycrystalline portion of the chromium oxide film.

According to another embodiment of the present disclosure, a method for hardening chromium oxide films is provided. The method includes forming, at room temperature, a chromium oxide film having an amorphous portion on an amorphous substrate; and exposing, at room temperature, the chromium oxide film to an electron beam having an accelerating voltage of more than 100 kilovolts to crystallize the amorphous portion of the chromium oxide film.

According to another embodiment of the present disclosure, a method for hardening chromium oxide films is provided. The method includes exposing a media facing side of a chromium oxide component to an electron beam having an accelerating voltage of at least 100 kilovolts to crystallize at least a portion of the chromium oxide component, wherein the chromium oxide component is a part of a tape head.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a method includes forming a chromium oxide overcoat on a media facing side of a plurality of thin films, the thin films having at least one transducer formed therein; and exposing at least a portion of the overcoat to a beam of charged particles for hardening a portion of the overcoat of the thin films.

In a further general embodiment, a method includes forming a thin film chromium oxide layer above a substrate; and exposing the chromium oxide layer to a beam of charged particles for converting an amorphous component of at least a portion of the chromium oxide layer to a crystalline state.

Figure 1A:
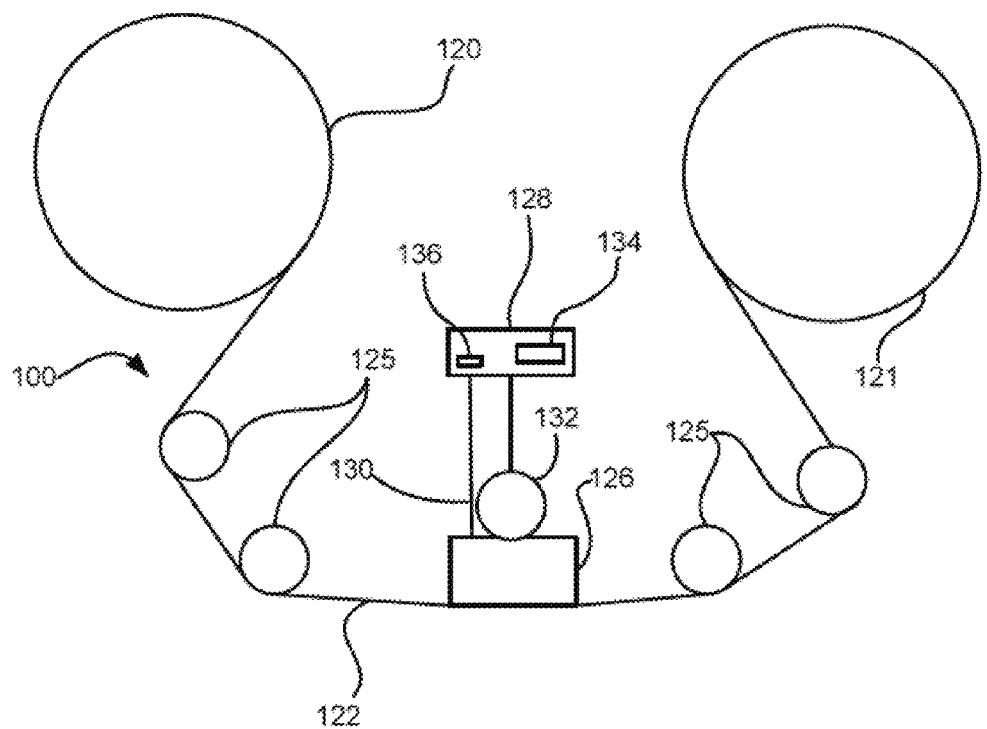
FIG. 1A is a schematic diagram of a simplified tape drive system, in accordance with an embodiment of the present disclosure.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may operate under logic known in the art, as well as any logic disclosed herein. The controller 128 may be coupled to a memory 136 of any known type, which may store instructions executable by the controller 128. Moreover, the controller 128 may be configured and/or programmable to perform or control some or all of the methodology presented herein. Thus, the controller may be considered configured to perform various operations by way of logic programmed into a chip; software, firmware, or other instructions being available to a processor; etc. and combinations thereof.

The cable 130 may include read/write circuits to transmit data to the tape head 126 to be recorded on the tape 122 and to receive data read by the tape head 126 from the tape 122. An actuator 132 controls position of the tape head 126 relative to the tape 122.

An interface 134 may also be provided for communication between the tape drive 100 and a host (integral or external) to send and receive the data and for controlling the operation of the tape drive 100 and communicating the status of the tape drive 100 to the host, all as will be understood by those of skill in the art.

Figure 1B:
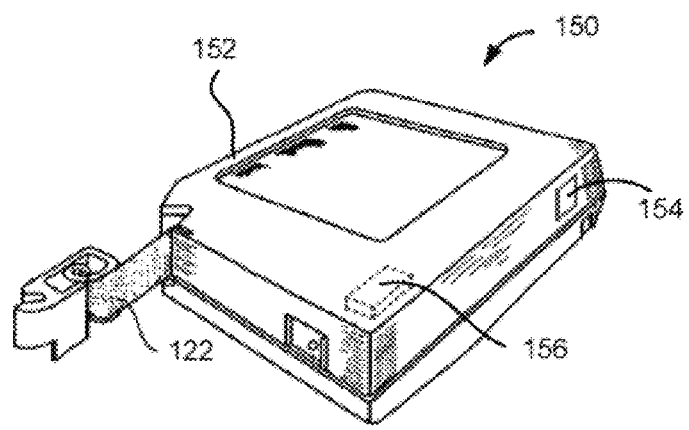
FIG. 1B is a schematic diagram of a tape cartridge, in accordance with an embodiment of the present disclosure.

FIG. 1B illustrates an example tape cartridge 150 according to an embodiment of the present disclosure. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 2A:
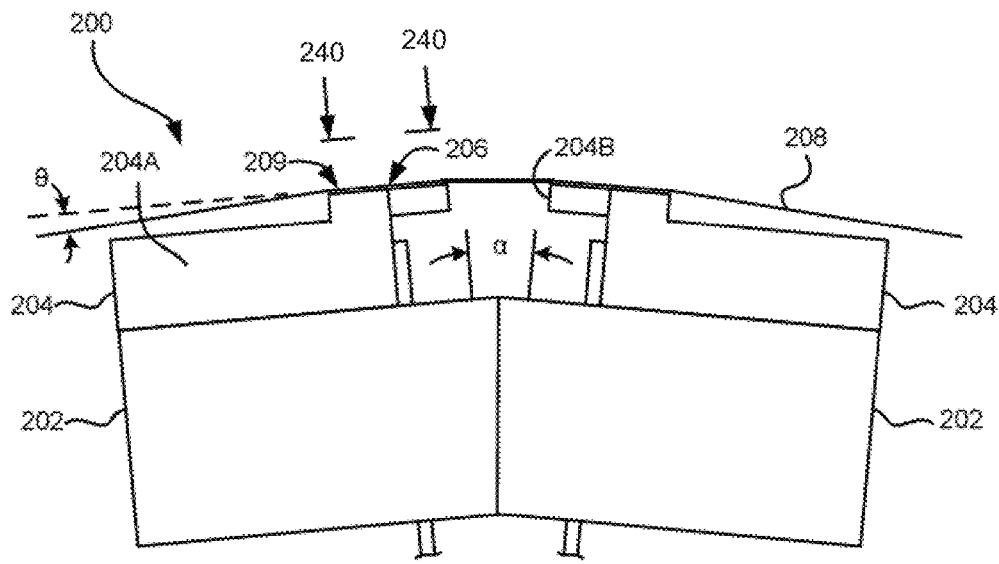
FIG. 2A illustrates a side view of a flat-lapped, bi-directional, two-module magnetic tape head, in accordance with an embodiment of the present disclosure.

By way of example, FIG. 2A illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at each edge going onto and exiting the flat media bearing surface 209 is usually between about 0.1 degree and about 5 degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo track readers for reading servo data on the medium.

Figure 2B:
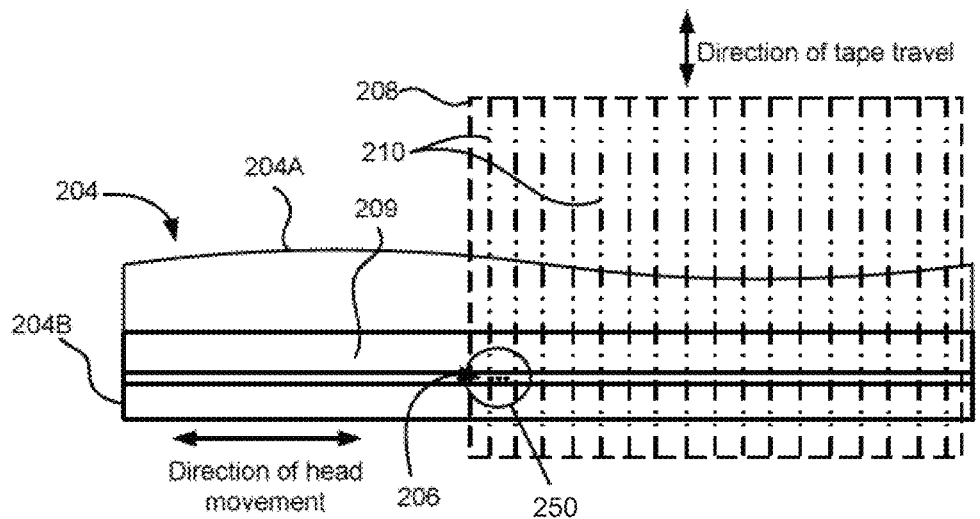
FIG. 2B is a tape bearing surface view taken from line 240 of FIG. 2A.

FIG. 2B illustrates the tape bearing surface 209 of one of the modules 204 taken from line 240 of FIG. 2A. A representative tape 208 is shown in dashed lines. The module 204 is preferably long enough to be able to support the tape as the head steps between data bands.

In this example, the tape 208 includes 4 to 22 data bands, e.g., with 16 data bands and 17 servo tracks 210, as shown in FIG. 2B on a one-half inch wide tape 208. The data bands are defined between servo tracks 210. Each data band may include a number of data tracks, for example 512 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2C:
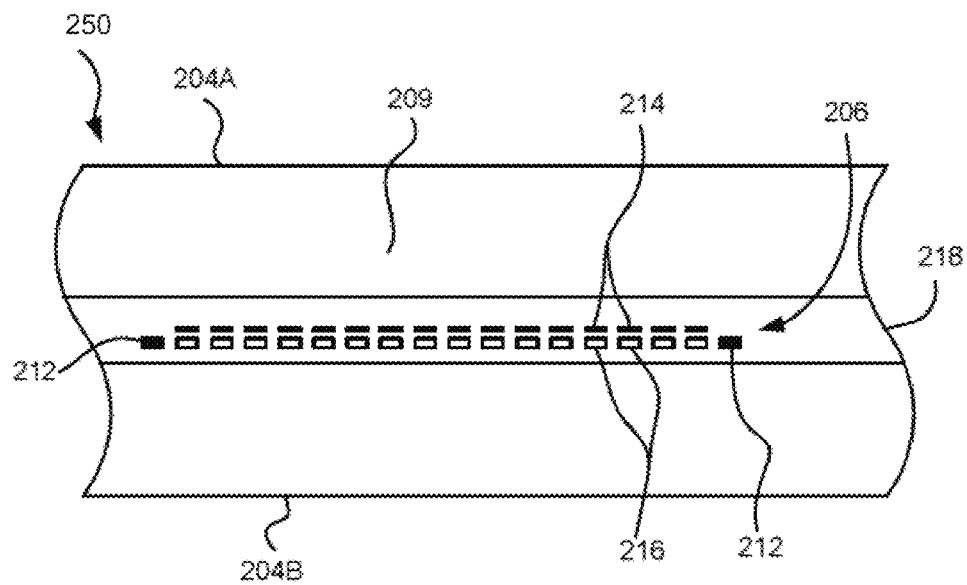
FIG. 2C is an enlarged view of a region indicated by circle 250 of FIG. 2B.

FIG. 2C depicts an enlarged view of a region indicated by circle 250 of FIG. 2B. The region indicated by circle 250 includes a plurality of readers and/or writers 206 formed in a gap 218 on the module 204. As shown, the array of readers and writers 206 includes, for example, 16 writers 214, 16 readers 216 and two servo readers 212, though the number of elements may vary. Illustrative embodiments include 8, 16, 32, 40, and 64 readers and/or writers 206 per array. A preferred embodiment includes 32 readers per array and/or 32 writers per array, where the actual number of transducing elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2C, the readers 216 and writers 214 may also be arranged in an interleaved configuration. Alternatively, each array of readers and/or writers 206 may be readers or writers only, and the arrays may contain one or more servo readers 212. As noted by considering FIGS. 2A-C together, each module 204 may include a complementary set of readers and/or writers 206 for such things as bi-directional reading and writing, read-while-write capability, backward compatibility, etc.

Figure 2D:
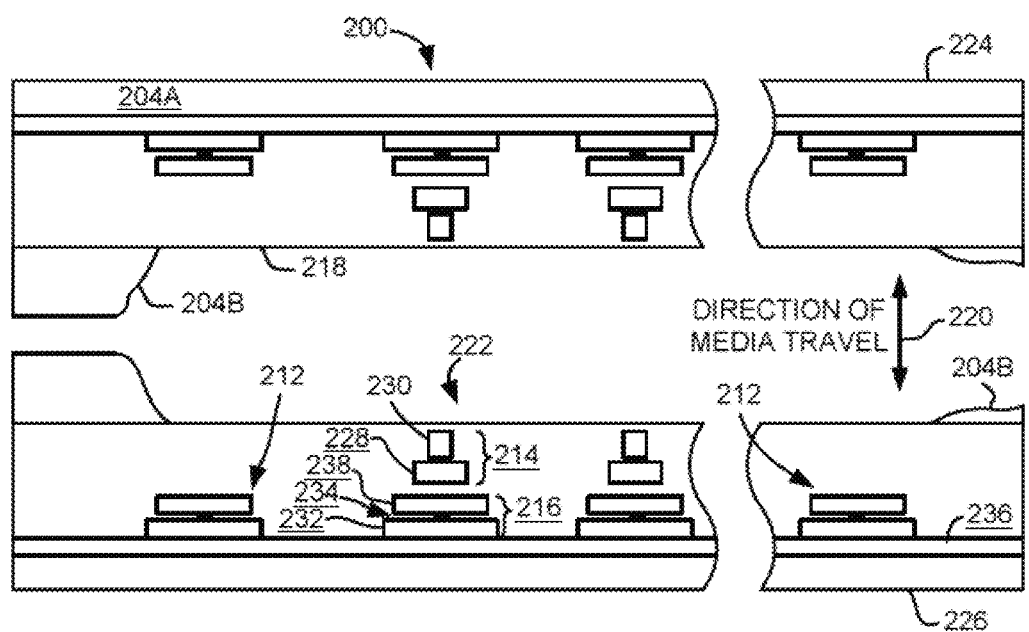
FIG. 2D is a detailed view of a partial tape bearing surface of a pair of modules.

FIG. 2D shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and magnetic tape head 200 operate in a transducing relationship in the manner well-known in the art. The piggybacked MR magnetic tape head 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback magnetic tape head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 3:
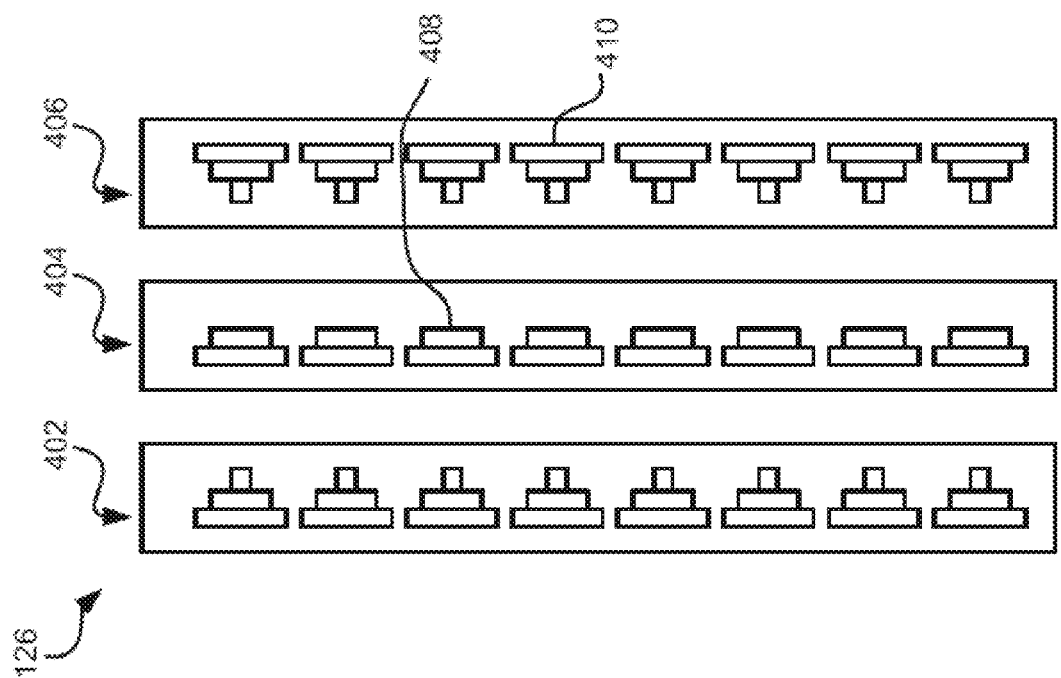
FIG. 3 is a partial tape bearing surface view of a magnetic head having a write-read-write configuration.
Figure 4:
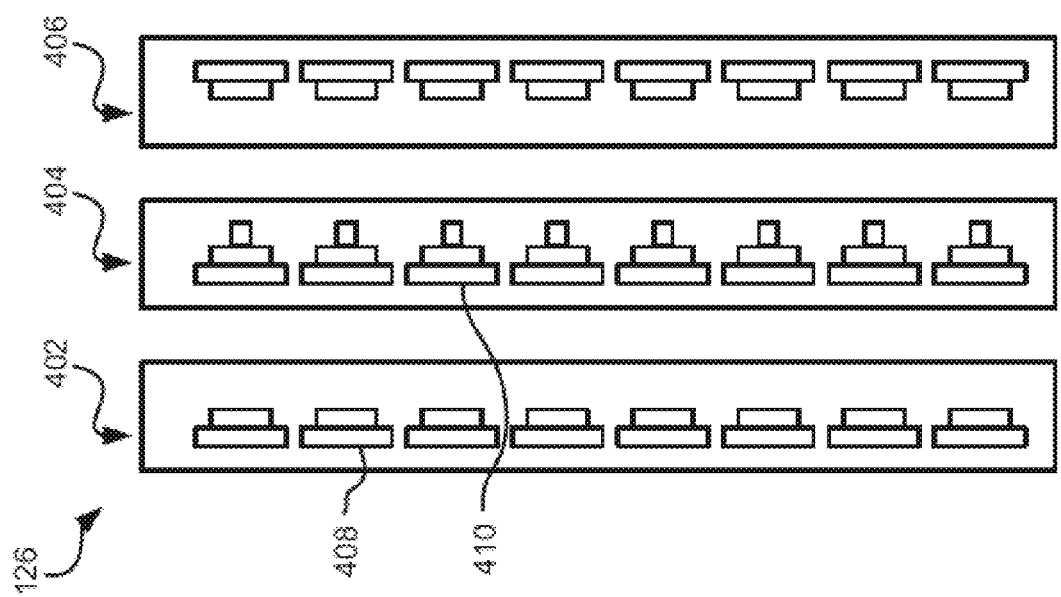
FIG. 4 is a partial tape bearing surface view of a magnetic head having a read-write-read configuration.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 402, 406 each include one or more arrays of writers 410. The inner module 404 of FIG. 3 includes one or more arrays of readers 408 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
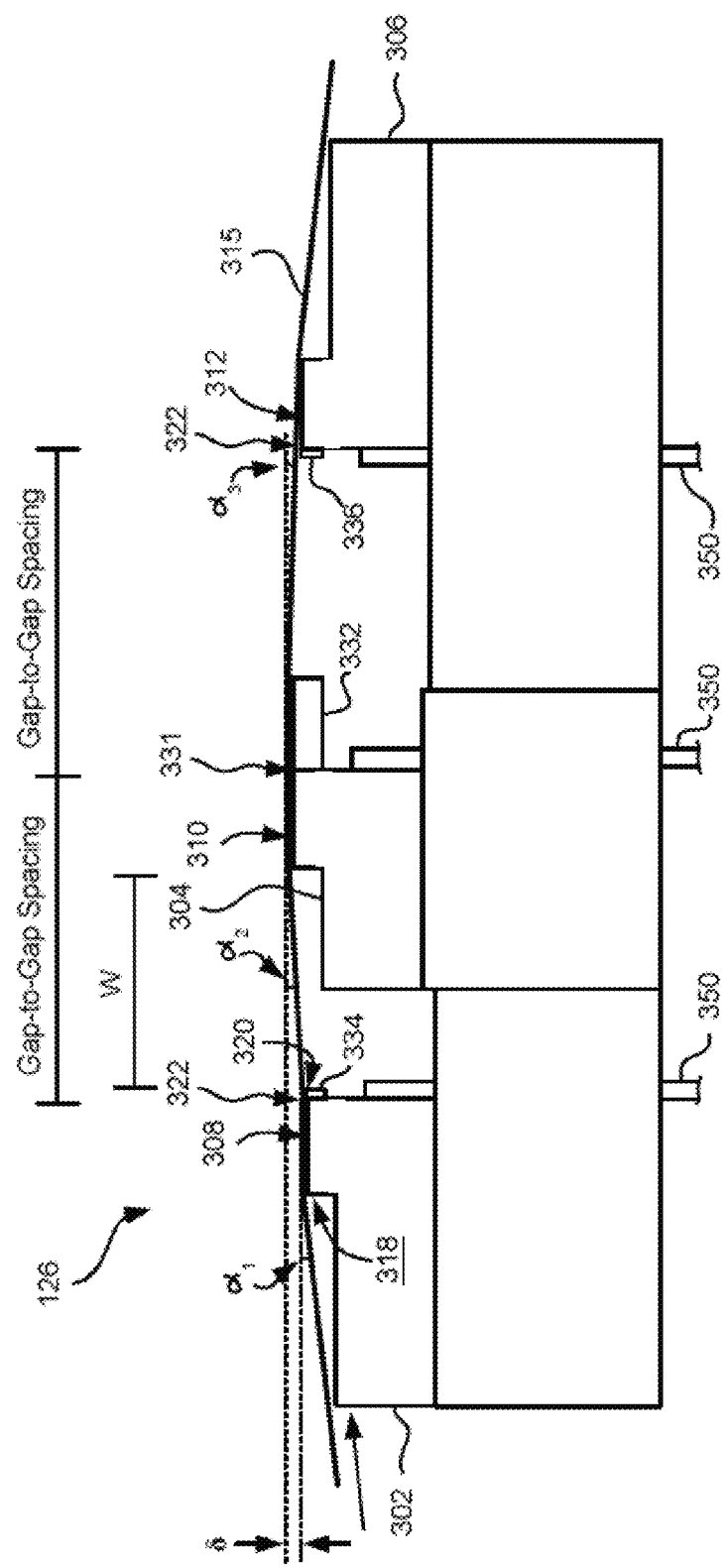
FIG. 5 is a side view of a magnetic tape head with three modules according to an embodiment of the present disclosure where the modules all generally lie along about parallel planes.

FIG. 5 illustrates a magnetic tape head 126 according to an embodiment of the present disclosure of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
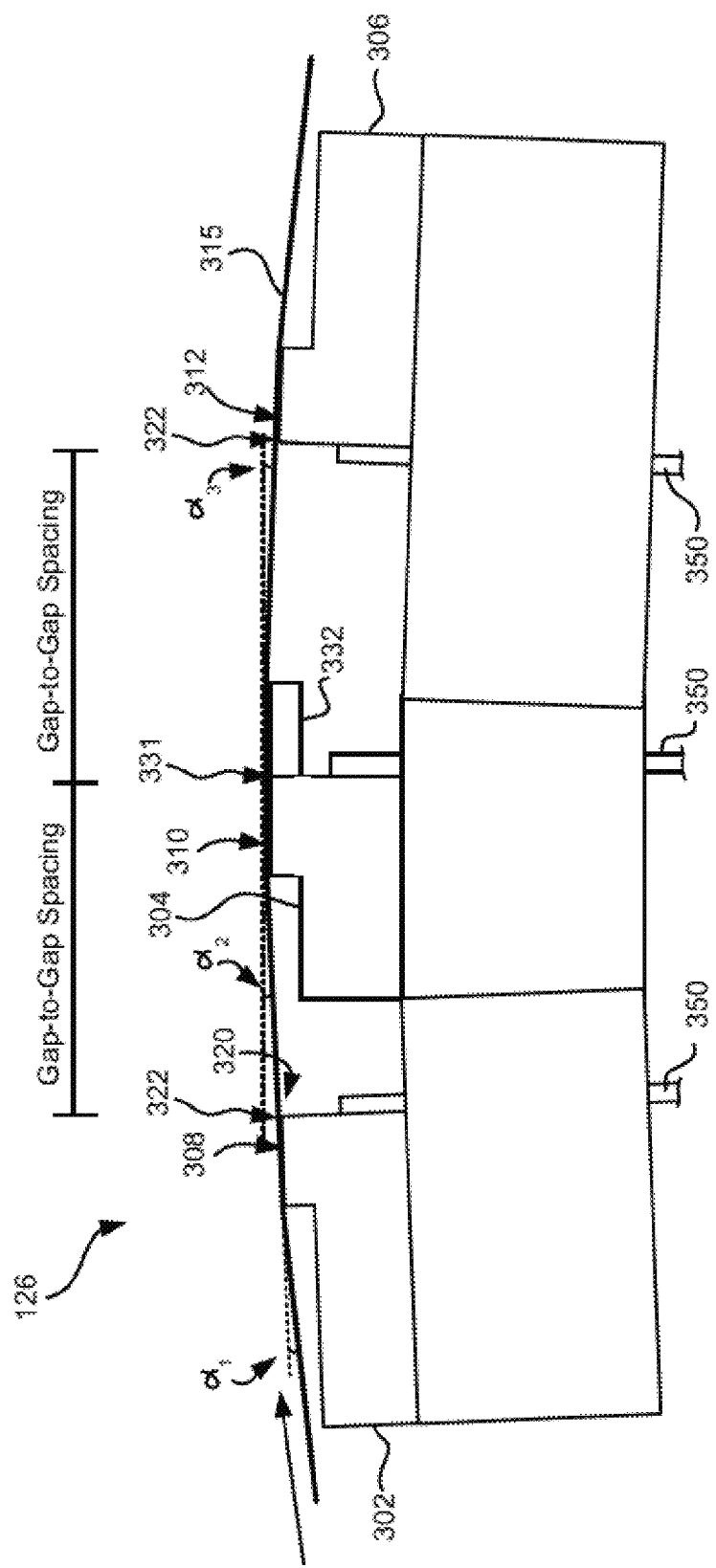
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read elements and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.5° to about 1.1°, though can be any angle required by the design.

Beneficially, the inner wrap angle $\alpha_2$ may be set slightly less on the side of the module 304 receiving the tape (leading edge) than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 25-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than standard LTO tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
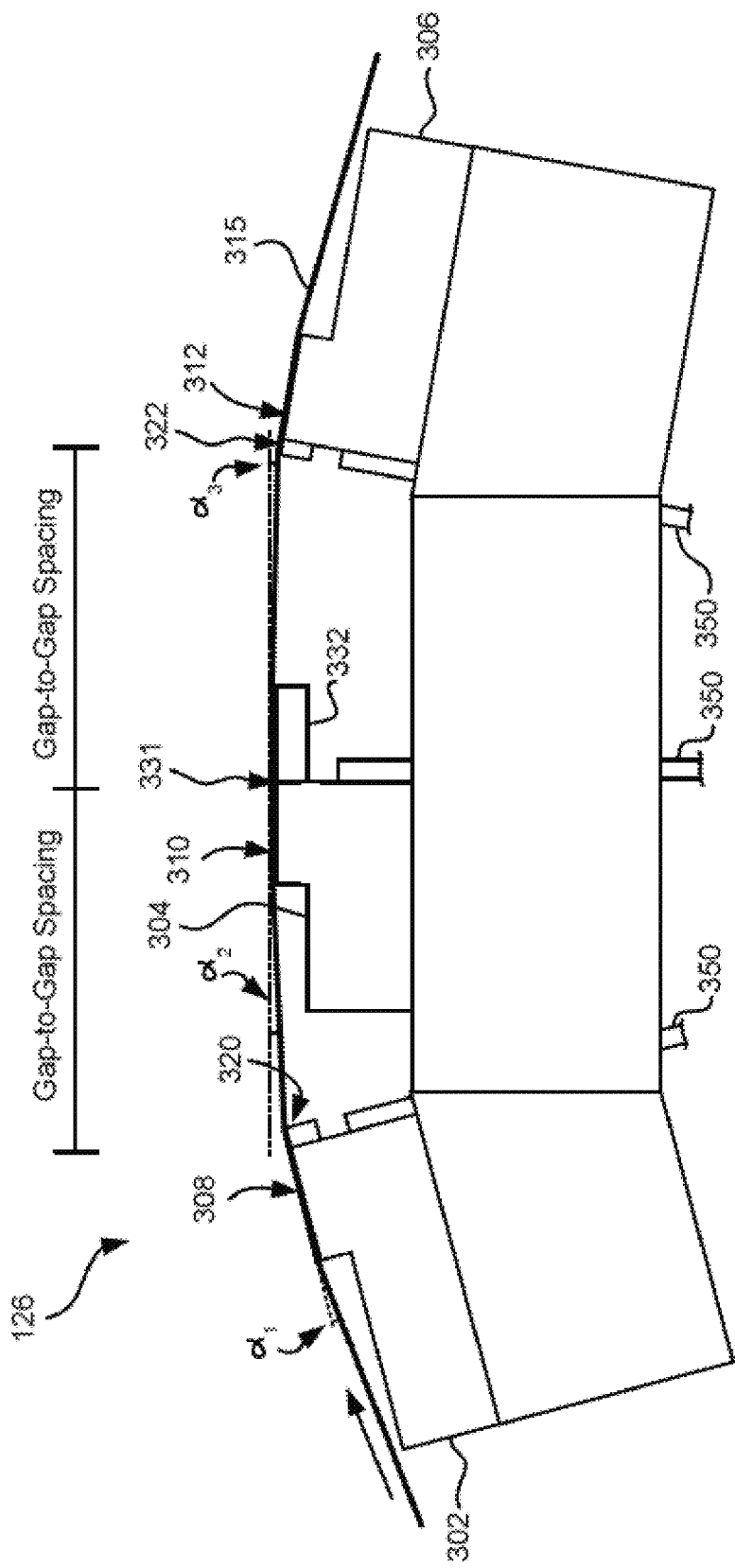
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures will force a wider gap-to-gap separation. Therefore a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module tape head 126 may use cables 350 having leads on the same pitch as current 16 channel piggyback LTO modules, or alternatively the connections on the module may be organ-keyboarded for a 50% reduction in cable span. Over-under, writing pair unshielded cables can be used for the writers, which may have integrated servo readers.

The outer wrap angles $\alpha_1$ may be set in the drive, such as by guides of any type known in the art, such as adjustable rollers, slides, etc. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head can be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads.

Conventionally, limitations on areal density are imposed by loss of signal quality due to increase in head-media spacing resulting from head wear. A method used by the industry to improve such head wear includes pre-recessing and coating the magnetic head. However, increase in magnetic spacing results from pre-recession and the coating itself.

Another method used in an attempt to improve head wear is laminating the magnetic films in the gap to increase wear resistance. However, this method has major drawbacks, due to the difficulty in tailoring both magnetic and mechanical properties simultaneously. Moreover, the potential for corrosion may be increased and non-laminated portions of the magnetic head may still be subject to wear.

Yet another method used in an attempt to improve head wear is crystallizing amorphous aluminum oxide films or other dielectric materials in the magnetic head that are subject to wear. In one approach, an aluminum oxide film is exposed to an electron beam to produce an at least partially polycrystalline aluminum oxide media-facing surface. The electron beam can have an accelerating voltage in the range of 10 kV to 100 kV (kilovolts) and a current in the range of 1 nA (nanoamp) to 1 µA (microamp), depending on the specific approach.

The present disclosure recognizes a need to develop wear-resistant films that are tougher than the polycrystalline aluminum oxide films described herein. While polycrystalline aluminum oxide films are adequate to resist the abrasion effects of barium ferrite recording media, it would be advantageous to develop tougher wear-resistant films. Tougher wear-resistant films could allow for a reduction in film thickness and a corresponding reduction head-media spacing (i.e., sensor-media and writer-media spacing). One method of creating tougher wear-resistant films is depositing aluminum oxide films at elevated temperatures. Another method of creating tougher wear-resistant films is post-deposition annealing of aluminum oxide films. Various tape head components, however, can be damaged at elevated temperatures during annealing and various other processes. Consequently, increases in the toughness of aluminum oxide films are limited by thermal constraints.

The present disclosure provides a method for hardening chromium oxide films in the magnetic head that are subject to wear, independent of how they are deposited. In some embodiments, the method includes hardening one or more partially polycrystalline portions of chromium oxide films to increase wear resistance. In other embodiments, the method includes hardening one or more amorphous portions of chromium oxide films to increase wear resistance. In yet other embodiments, the method includes hardening partially polycrystalline portions and amorphous portions of chromium oxide films to increase wear resistance.

Chromium oxide, as used herein, includes chromium(III) oxide (i.e., $Cr_2O_3$) and any other oxide of chromium which would be apparent to one skilled in the art upon reading the present disclosure.

Figure 8:
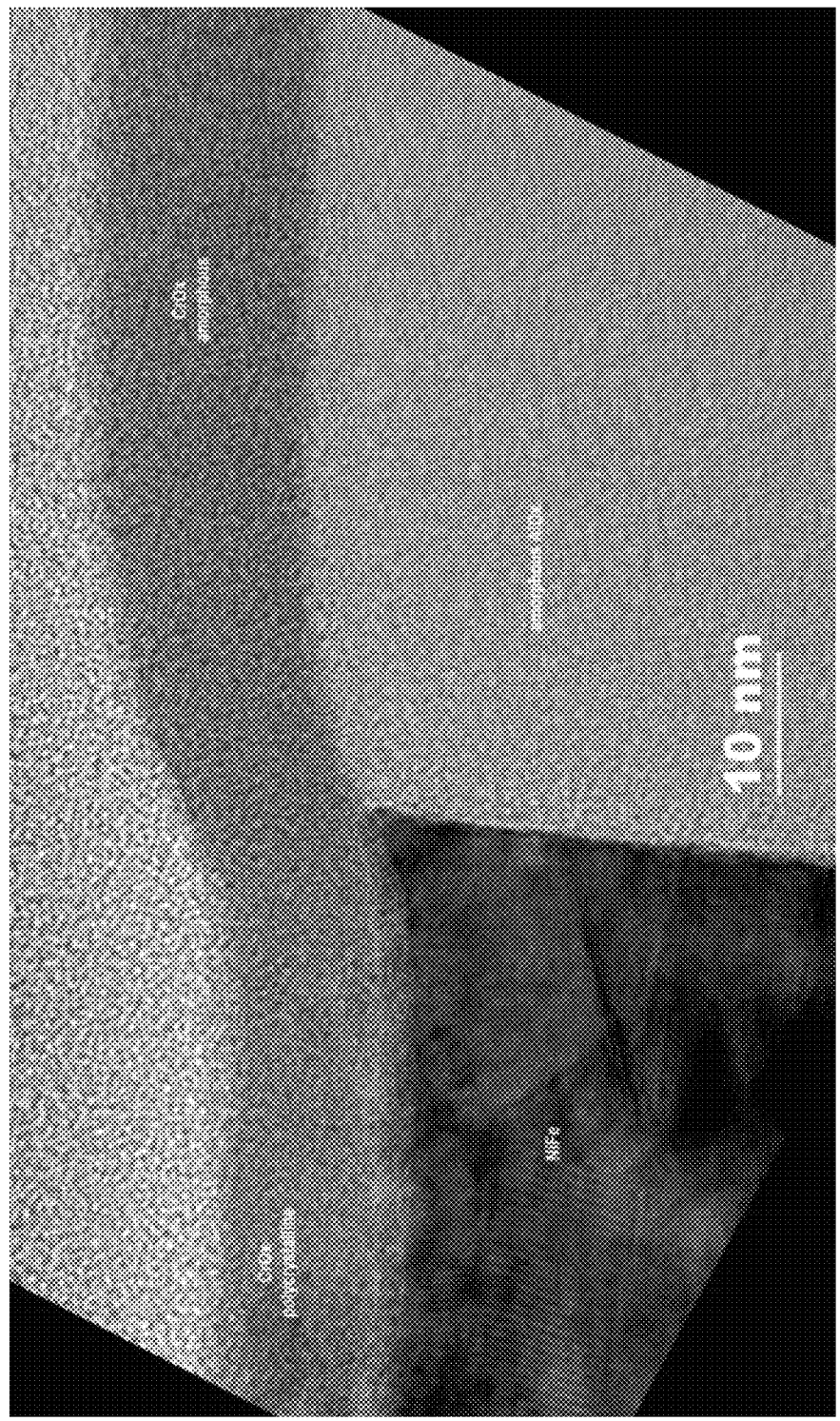
FIG. 8 is a transmission electron micrograph of a chromium oxide layer that overlies a nickel-iron (NiFe) substrate and an amorphous aluminum oxide substrate.

FIG. 8 is a transmission electron micrograph of a chromium oxide layer that overlies a nickel-iron (NiFe) substrate and an amorphous aluminum oxide substrate. It was determined, from micrographs like the one shown in FIG. 8, that chromium oxide, unlike aluminum oxide, forms polycrystalline structures on crystalline substrates at room temperature. At least low-grade polycrystalline chromium oxide structures were observed on nickel-iron (NiFe) substrates, as shown in FIG. 8. This is advantageous because, in at least some embodiments, argon plasma sputtered NiFe is used for shields on magnetic recording heads. In other micrographs, polycrystalline chromium oxide structures were also observed on crystalline aluminum oxide/titanium carbide (AlOx/TiC) substrates. On amorphous aluminum oxide substrates, however, as-sputtered chromium oxide films were found to be amorphous, as shown in FIG. 8. It was determined that the phase of the substrate determines, at least in part, the properties of as-sputtered chromium oxide films.

When compared to aluminum oxide wear-resistant films, chromium oxide films have some advantages. For example, crystallized chromium oxide is harder and more wear resistant than crystallized aluminum oxide. Chromium oxide is also more resistant to some forms of corrosion. In general, however, the degree of crystallinity of as-sputtered chromium oxide films is lower than electron-beam crystallized aluminum-oxide films. Nevertheless, the ability of chromium oxide to form polycrystalline structures at room temperature is advantageous due to thermal constraints imposed by antiferromagnetic layers, tunnel junctions, pinned layers, free layers, and various other components of magnetic tape heads. Heating these components can cause interdiffusion that can severely degrade tape head performance. In addition, exposing as-sputtered chromium oxide films to beams of charged particles (e.g, electron beams) significantly increases the degree of crystallinity, hardness, and wear resistance of chromium oxide films, as described herein.

According to various embodiments, the beam of charged particles includes a beam of electrons, positrons, protons, ions of noble gasses, or other species, etc. In embodiments where the beam of charged particles incorporates an electron beam, the electron beam may incorporate, but is not limited to, a Gaussian electron beam.

Figure 9:
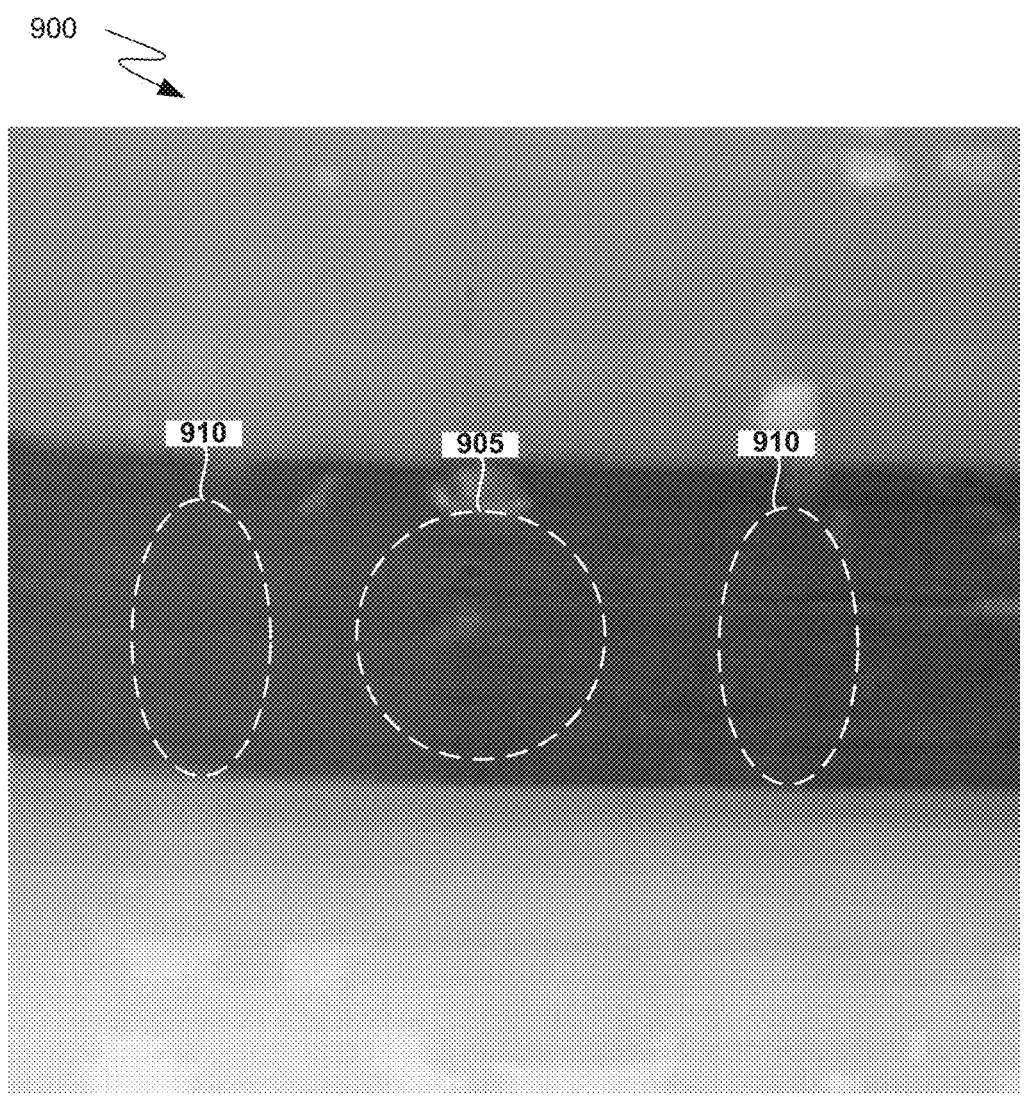
FIG. 9 is an optical micrograph of a partially polycrystalline chromium oxide tape head surface.

FIG. 9 is an optical micrograph of a partially polycrystalline chromium oxide tape head surface 900. The chromium oxide tape head surface 900 includes a hardened region 905 and as-sputtered regions 910. Both the hardened region 905 and the as-sputtered regions overlie a NiFe shield, and therefore, the as-sputtered regions 910 are partially polycrystalline. The hardened region 905 was exposed for approximately sixty minutes to an electron beam having an accelerating voltage of approximately 100 kV and a current of approximately 135 nA. Nanoindentation hardness measurements of material in the as-sputtered regions 910 indicated an average hardness of 9.94 gigapascals (GPa). Nanoindentation hardness measurements of material in the hardened region indicated an average hardness of 12.67 GPa, an increase of approximately 27.5% relative to the as-sputtered regions.

Amorphous chromium oxide films were exposed to electron beams under the same conditions as the chromium oxide tape head surface 900 with no increase in hardness. Transmission electron microscopy of the amorphous chromium oxide films confirmed that the exposure regime did not induce amorphous-to-crystalline phase transformations in the amorphous chromium oxide films.

It was determined that chromium oxide crystallites in partially polycrystalline chromium oxide films lower the crystallization energy threshold, and that the crystallites provide crystallization centers for amorphous material in the partially polycrystalline films. Electron beam exposure thereby induces amorphous-to-crystalline phase transitions in partially polycrystalline chromium oxide films, which increase the degree of crystallinity and hardness of the chromium oxide films. It was also determined that some electron-beam exposure regimes can induce crystalline-to-crystalline phase transitions in chromium oxide films. The crystalline-to-crystalline phase transitions can result in hardening as well.

Prolonged electron beam exposure can, however, at least partially metalize chromium oxide films. While the mohs hardness of chromium oxide (e.g., $Cr_2O_3$) is 9, the mohs hardness of metallic chromium is 8.5. Consequently, prolonged exposure can produce a drop in the hardness of a chromium oxide film. The duration of exposure should be limited depending on the desired properties of the film. Persons of ordinary skill in the art will understand that the appropriate duration of exposure depends, at least in part, on the accelerating voltage, the current, and the area to be irradiated. If a current of 100 nA is used, for example, the irradiated area can be exposed for 100 minutes to reach a desired hardness under some conditions. In another example, the irradiated area can be exposed for as little as 10 µs (microseconds) to reach a desired hardness if a current of 10 µA is used.

Figure 10:
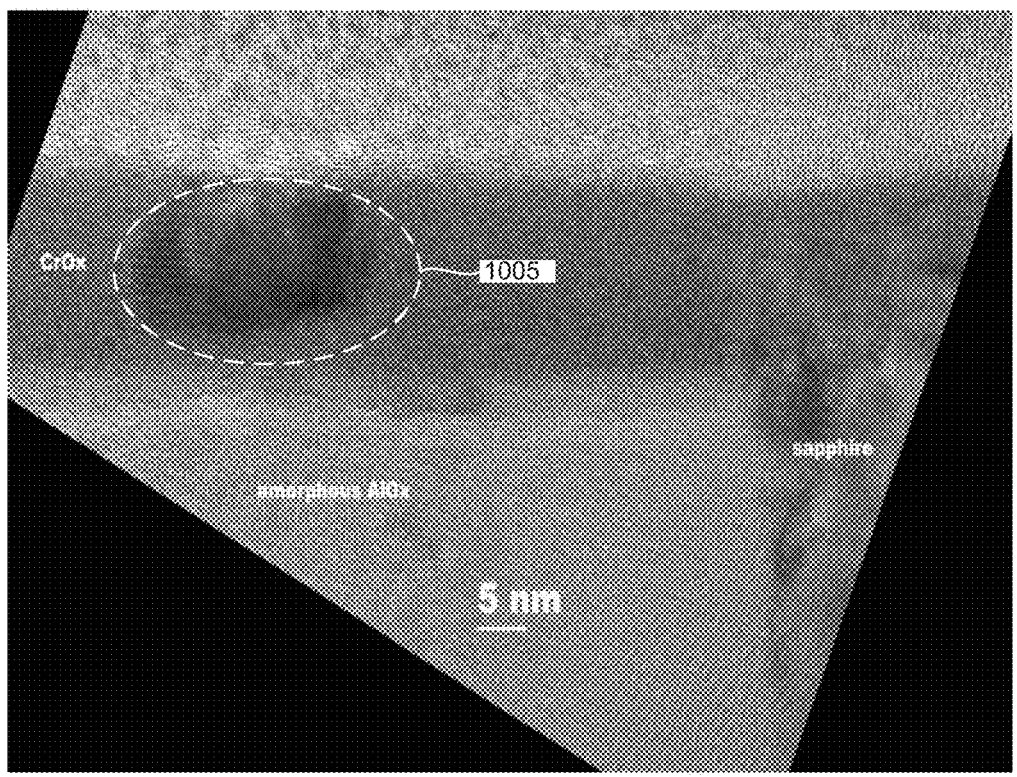
FIG. 10 is a transmission electron micrograph of a chromium oxide layer that overlies an amorphous aluminum oxide substrate and a sapphire substrate.

FIG. 10 is a transmission electron micrograph of a chromium oxide layer that overlies an amorphous aluminum oxide substrate and a sapphire substrate (i.e., a crystalline aluminum oxide substrate). As described herein, the portion of the chromium oxide layer that overlies the amorphous aluminum oxide substrate is amorphous. An exposed portion 1005 of the chromium oxide layer was exposed for approximately one minute to an electron beam having an accelerating voltage of 200 kV and a current of 180 nA. Prior to exposure, material within the exposed portion 1005 was amorphous. Analysis of material within the exposed portion 1005 showed that the material was at least partially crystallized and/or metallized after the exposure. It was further determined that localized exposure to electron beams having accelerating voltages above 100 kV can crystallize amorphous chromium oxide. At 200 kV, crystallization is very fast, even when relatively low current are used. Accelerating voltage that are significantly higher than 200 kV, however, likely metallize chromium oxide and increase the risk of causing a short in the tape head.

Figure 11:
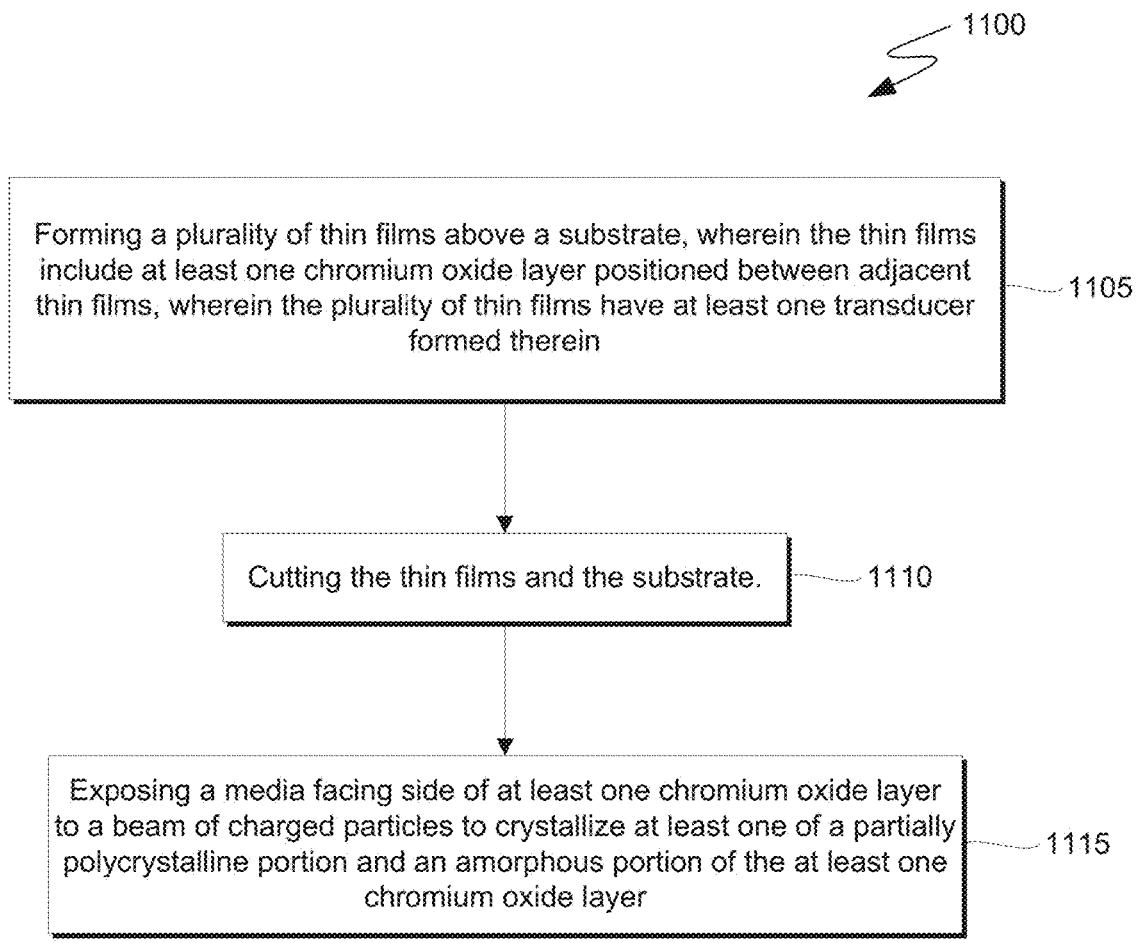
FIG. 11 is a flow diagram of a method, in accordance with an embodiment of the present disclosure.

FIG. 11 is a flowchart that describes a method 1100 for constructing a tape head that includes electron-beam hardened chromium oxide layers, in accordance with one embodiment. As an option, the present method 1100 may be implemented in conjunction with features from any other embodiment listed herein, such as those described with reference to the other FIGS. Of course, however, such method 1100 and others presented herein may be used in various applications and/or in permutations which may or may not be specifically described in the illustrative embodiments listed herein. Further, the method 1100 presented herein may be used in any desired environment.

Now referring to FIG. 11, a method 1100, according to one illustrative embodiment includes forming a plurality of thin films above a substrate, wherein the thin films include at least one chromium oxide layer positioned between adjacent thin films, wherein the plurality of thin films have at least one transducer formed therein. See operation 1105.

With continued reference to FIG. 11, the method 1100 includes cutting the thin films and substrate. See operation 1110.

After cutting the thin films and the substrate, a media facing side of at least one chromium oxide layer is exposed to a beam of charged particles to crystallize at least one of a partially polycrystalline portion and an amorphous portion of the at least one chromium oxide layer. In various approaches, the crystalline state may include partially or fully crystalline chromium oxide or polycrystalline chromium oxide.

Depending on the exposure conditions, the depth of crystallization can vary. Various exposure conditions can be used to tune the electron beam such that the media facing side of the exposed layer(s) are able to withstand longer exposure times and thus achieve larger crystallization depths. It is preferable to incorporate exposure conditions which allow for longer exposure times without causing damage to the media facing side of exposed layer(s).

Methods described and/or suggested herein may be conducted during processing, or after the head is built. In a preferred approach, the methods described and/or suggested herein may be conducted after the dielectric materials in the magnetic head subject to wear are deposited. According to various approaches, no special preparation other than what would be determined by one skilled in the art is necessary for depositing the dielectric materials.

In one embodiment, a side of a chromium oxide layer is exposed to a beam of charged particles for converting an amorphous and/or partially polycrystalline component of at least a portion of a chromium oxide layer to a crystalline state, wherein the side of the chromium oxide layer of extends between adjacent layers of any type. In one approach, the chromium oxide layer is positioned between the adjacent layers, the chromium oxide layer being formed above one of the adjacent layers, another of the adjacent layers being formed above the chromium oxide layer. Thus, the side of the chromium oxide layer may be oriented non-parallel to the planes of deposition of the thin films, such as a surface formed by milling, cutting, dicing, laser ablating, etc. In another approach, the side of the chromium oxide layer that is exposed may be a remaining portion of a layer formed over an oblique surface and then planarized to define the side.

The foregoing general methodology may be used to create any type of device. In one embodiment, a device includes a substrate; and a plurality of thin films above the substrate, the thin films having at least one chromium oxide layer. The at least one chromium oxide layer has a more crystalline structure towards a first end thereof than towards an end thereof opposite the first end.

In one illustrative embodiment, a method includes exposing at least a portion of a sectioned surface (e.g., a media facing side) of a substrate and a plurality of thin films formed above the substrate to a beam of charged particles for converting an amorphous and/or partially polycrystalline component of at least a portion of a chromium oxide layer of the thin films to a crystalline state, where the crystalline state may include partially crystalline, fully crystalline, at least partially polycrystalline, etc. The sectioned surface refers to some surface of the thin films generally oriented non-parallel to the planes of deposition of the thin films, such as a surface formed by milling, cutting, dicing, laser ablating, etc.

The thin films may have at least one transducer formed therein, or any other configuration. In one approach, the at least one transducer may incorporate a sensor including, but not limited to Tunneling Magnetoresistance (TMR) sensors, Anisotropic Magnetoresistive (AMR) sensors, Giant Magnetoresistance (GMR) sensors, etc. The at least one transducer may also or alternatively include a writer. In another approach, the at least one transducer includes a writer, where an aluminum oxide oxide layer is positioned in a write gap thereof. In yet another approach, the transducer is a servo pattern writer of known design and having at least two write gaps, aluminum oxide layers being in the at least two gaps. The aluminum oxide layers may be made to have a more crystalline structure towards media facing ends thereof than toward the opposite end thereof.

The chromium oxide layer may be positioned anywhere in the thin film stack. For example, in another approach, the chromium oxide layer may be positioned (e.g., sandwiched) between the sensor and a shield. In another approach, the chromium oxide layer may be positioned between adjacent thin films such as the writer poles.

Preferably, the plurality of thin films may be formed prior to the aforementioned exposure taking place. The exposure may be applied to the entire media facing side, thereby potentially crystallizing portions of all partially polycrystalline or amorphous layers susceptible to crystallization in such a manner.

In other approaches, the exposure may be selective, for only exposing one or a select few of the partially polycrystalline or amorphous layers. According to one approach, the beam of charged particles may be rastered across selected areas of the media facing side, or across a selected chromium oxide layer.

In yet another approach, the beam of charged particles may include a shaped beam from a tool capable of directly exposing selected areas of the media facing side, the chromium oxide layer, areas within films in the wafer, etc. In still another approach, masking of a type known in the art may be implemented such exposure from the beam of charged particles may be selective.

Figure 12:
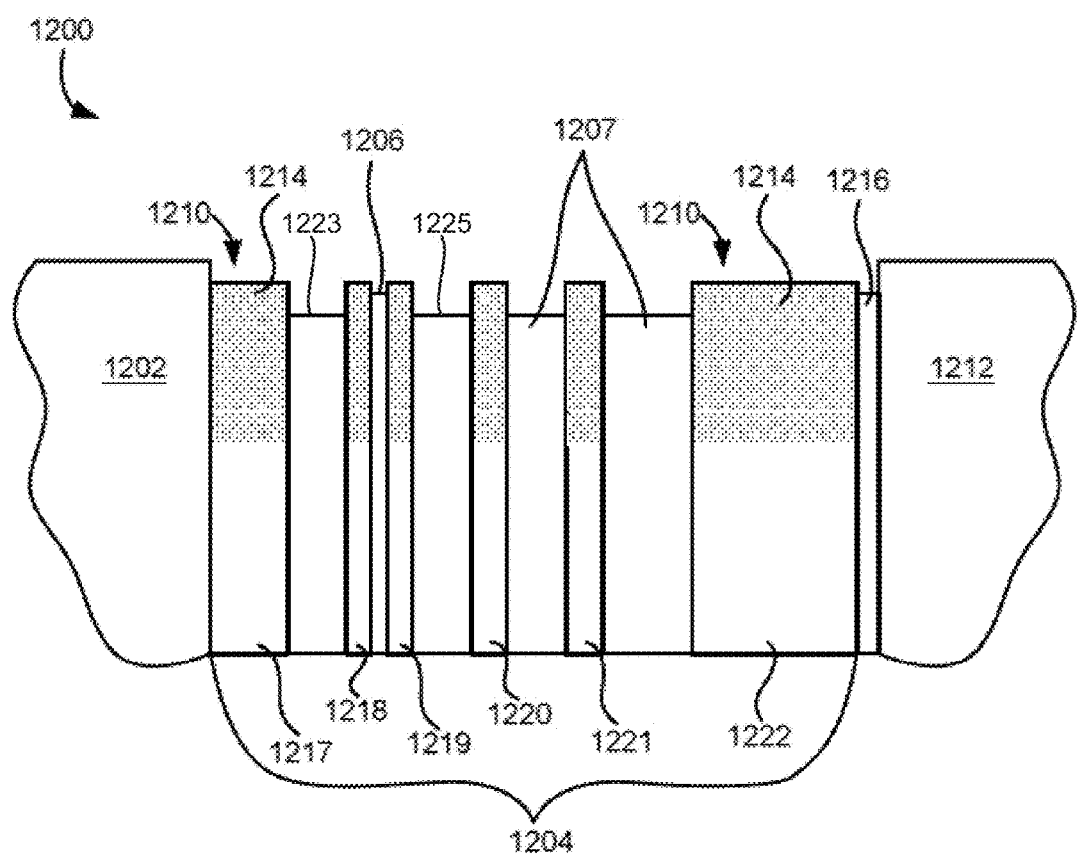
FIG. 12 is a partial cross-sectional view of a magnetic head having crystallization, in accordance with an embodiment of the present disclosure.

FIG. 12 depicts a magnetic head 1200, in accordance with an embodiment of the present disclosure. As an option, the present magnetic head 1200 may be implemented in conjunction with features from any other embodiment listed herein, such as those described with reference to the other FIGS. Of course, however, such magnetic head 1200 and others presented herein may be used in various applications and/or in permutations which may or may not be specifically described in the illustrative embodiments listed herein. Further, the magnetic head 1200 presented herein may be used in any desired environment.

Referring to FIG. 12, according to one embodiment, a magnetic head 1200 may include a substrate 1202. According to various approaches, the magnetic head may include a tape head, a disk head, etc.

The magnetic head 1200 also includes a plurality of thin films 1204 above the substrate 1202. In one approach, the magnetic head 1200 may also include a closure 1212 and a bondline 1216.

The thin films 1204 of the magnetic head 1200 include at least one transducer 1206 formed therein.

In one approach, the at least one transducer 1206 may include a sensor and/or a plurality of writers 1207. In one approach, the sensor may include any of the sensors mentioned above, or any other sensor which would be apparent to one skilled in the art upon reading the present description.

The thin films 1204 include a first thin film 1217, a second thin film 1218, a third thin film, 1219, a fourth thin film 1220, a fifth thin film 1221, and a sixth thin film 1222. At least one of the thin films 1204 is a chromium oxide layer. In some embodiments and approaches, one or more of the thin films 1204 is an amorphous aluminum oxide layer. Persons of ordinary skill in the art will understand that such amorphous aluminum oxide layers can be hardened via electron-beam induced crystallization upon reading this description.

In the embodiment depicted in FIG. 12, the second thin film 1218 is positioned between the transducer 1206 (i.e., a sensor) and a first shield 1223 (e.g., a NiFe shield), and the fourth thin film 1220 is positioned between a second shield 1225 and one of the writers 1207. Upon reading the present disclosure, persons of ordinary skill in the art will understand that the second thin film 1218 and the fourth thin film 1220 are at least partially polycrystalline in embodiments where the second thin film 1218 and the fourth thin film 1220 are chromium oxide layers and the first shield 1223 and the second shield 1225 are formed of crystalline material (e.g., crystalline NiFe shields).

With continued reference to FIG. 12, the at least one chromium oxide layer may have a more crystalline structure 1214 towards a media facing end 1210 thereof than towards an end thereof opposite the media facing end 1210, where more crystalline means exhibiting a greater relative degree of crystallinity. In one approach, another of the chromium oxide layers may have a more crystalline structure towards the media facing end thereof than towards the end thereof opposite the media facing end, than the other chromium oxide layers.

In one embodiment, several of the chromium oxide layers may be present in the thin films. In one approach, as described above, the beam of charged particles may be applied to localized regions of the magnetic head, including a single chromium oxide layer.

Moreover, in one approach, one or more of the chromium oxide layers may be about completely amorphous or partially polycrystalline (e.g., has not been subject to the beam of charged particles) while another chromium oxide layer has a crystalline portion. In another approach, the depth and/or extent of crystallization may vary from layer to layer.

In another approach, the beam of charged particles may be applied to only a portion of the chromium oxide layer exposed to a media facing side to create a wear profile, for example.

Figure 13:
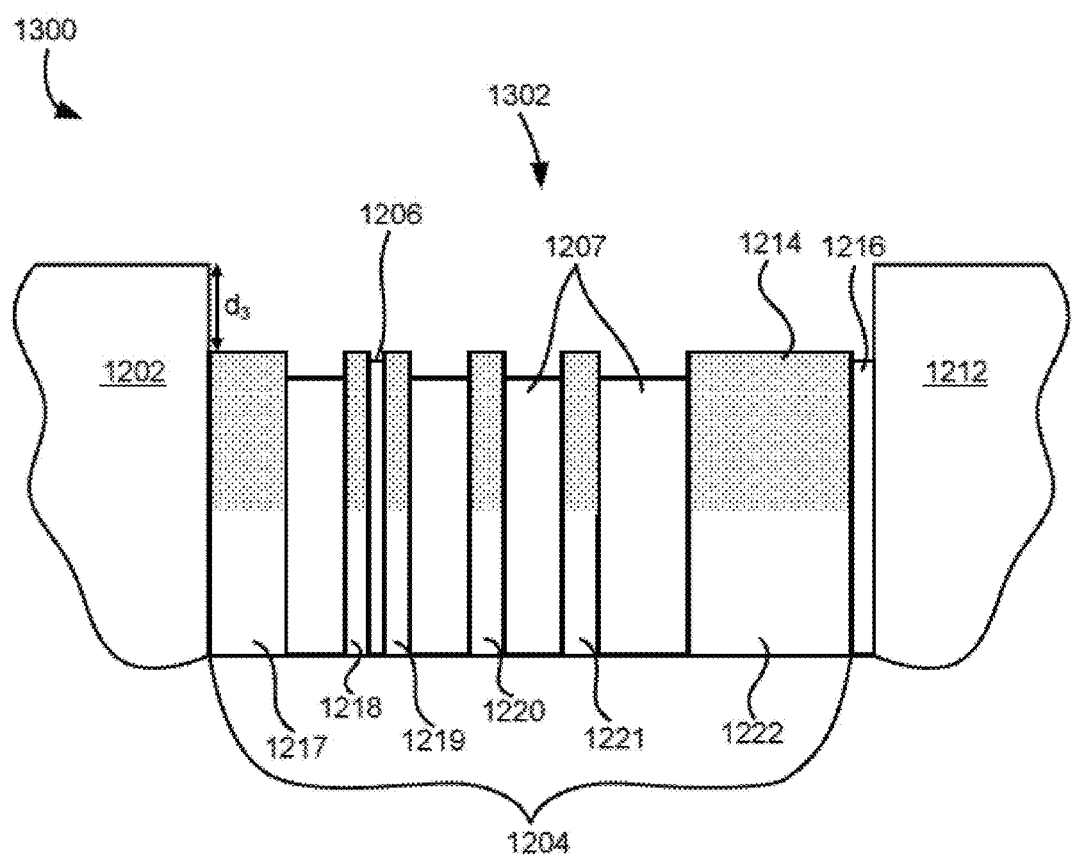
FIG. 13 is a partial cross-sectional view of a magnetic head having crystallization, in accordance with an embodiment of the present disclosure.

FIG. 13 depicts a magnetic head 1300, in accordance with an embodiment of the present disclosure. As an option, the present magnetic head 1300 may be implemented in conjunction with features from any other embodiment listed herein, such as those described with reference to the other FIGS. Of course, however, such magnetic head 1300 and others presented herein may be used in various applications and/or in permutations which may or may not be specifically described in the illustrative embodiments listed herein.

Further, the magnetic head 1300 presented herein may be used in any desired environment.

Referring to FIG. 13, a magnetic head 1300, according to one embodiment, includes a media facing side 1302 of the thin film stack which may be recessed from a plane of a media facing side of the substrate 1202 by a distance $d_3$. According to various approaches, the distance $d_3$ may be between about 1 nm and about 50 nm, more preferably between about 3 nm and about 25 nm, but may be more or less depending on the desired embodiment.

Figure 14:
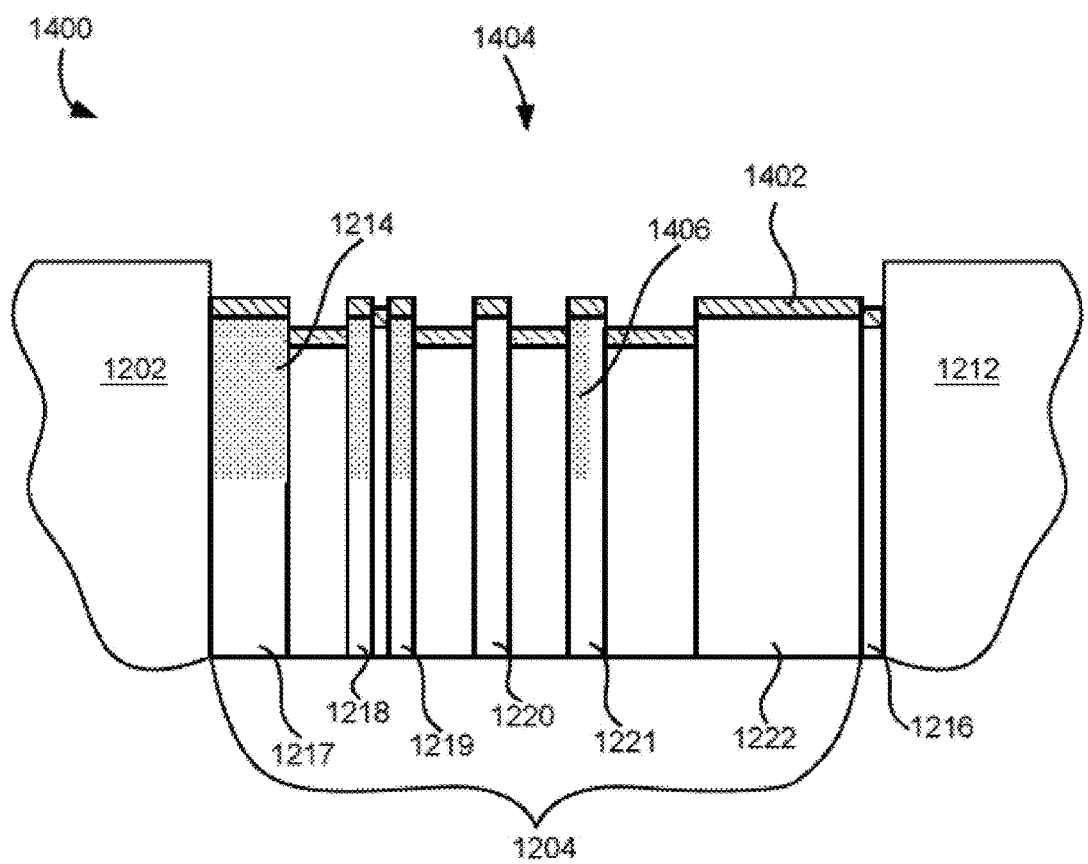
FIG. 14 is a partial cross-sectional view of a magnetic head having crystallization, in accordance with an embodiment of the present disclosure.

FIG. 14 depicts a magnetic head 1400, in accordance with an embodiment of the present disclosure. As an option, the present magnetic head 1400 may be implemented in conjunction with features from any other embodiment listed herein, such as those described with reference to the other FIGS. Of course, however, such magnetic head 1400 and others presented herein may be used in various applications and/or in permutations which may or may not be specifically described in the illustrative embodiments listed herein. Further, the magnetic head 1400 presented herein may be used in any desired environment.

According to the embodiment depicted in FIG. 14, a magnetic head 1400 may include a chromium oxide coating 1402 applied to the media facing side 1404 of the magnetic head 1400. Such magnetic head may be of any type, including any of those described herein. In one approach, the chromium oxide coating 1402 may be crystalized by incorporating any of the approaches described and/or suggested herein.

In one approach, the chromium oxide coating 1402 may be applied as a full coating, or in selected areas including over any transducers within the thin films 1204, over the bondline 1216, or over any of the thin films 1204 which would be apparent to one skilled in the art upon reading the present description. In one example, a chromium oxide overcoat is formed on the media facing side of the stack of thin films and at least a portion of the overcoat is exposed to a beam of charged particles for converting an amorphous or partially polycrystalline portion of the dielectric overcoat to a crystalline state. Persons of ordinary skill in the art will understand that various portions of the chromium oxide coating 1402 will be at least partially polycrystalline or amorphous depending on the properties of the layers underneath the chromium oxide coating 1402. The exposure can be stopped prior to any alteration of the underlying layers, or can be continued to covert one or more layers (e.g., chromium oxide or aluminum oxide layers) in the stack of thin films to an at least partially crystalline or polycrystalline state.

According to another approach, only some of the chromium oxide (or aluminum oxide) layers include a crystalline structure 1214 towards the media facing side of the substrate 1202. Furthermore, a chromium oxide layer can include a partial crystalline structure 1406 which spans only a portion of the entire width and/or thickness of the chromium oxide layer.

In one approach, the chromium oxide 1402 is applied in a pattern including any number of shapes, any type of shape, any orientation, or any frequency, to create a wear profile. Similarly, the chromium oxide coating 1402 can be selectively hardened in a pattern including any number of shapes, any type of shape, any orientation, or any frequency. A wear profile can help to prevent or reduce the frequency of instances where a tape "sticks" to the head surface as the head surface wears. In one example of a wear profile, stripes having increased hardness are aligned parallel to the tape movement direction on the chromium oxide coating 1402. In another example of a wear profile, stripes having increased hardness are aligned perpendicular to the tape movement direction on the chromium oxide coating 1402. Persons of ordinary skill in the art will understand that various attributes of the wear profile will depend on factors such as the surface profile of the tape head, tape thickness, and tape/head interface chemistry.

A method for creating a structure as shown in FIG. 14, according to one embodiment includes forming a chromium oxide overcoat on a media facing side of a stack of thin films, the thin films having at least one transducer formed therein; and exposing at least a portion of the overcoat to a beam of charged particles for converting at least one of a partially polycrystalline portion and an amorphous portion of the chromium oxide overcoat of the thin films to a crystalline state.

In one approach, the duration of the exposure is sufficient to convert at least a portion of at least one of chromium oxide (or aluminum oxide) layers in the thin film stack under the overcoat to a crystalline state. Thus, the particles travel through the overcoat and alter the underlying layers, as shown in FIG. 14. In another approach, the exposure is be stopped prior to any significant alteration of the underlying layers.

Alternatively, the thin films in the stack may be exposed prior to application of the overcoat, with subsequent application and exposure of the overcoat.

Figure 15:
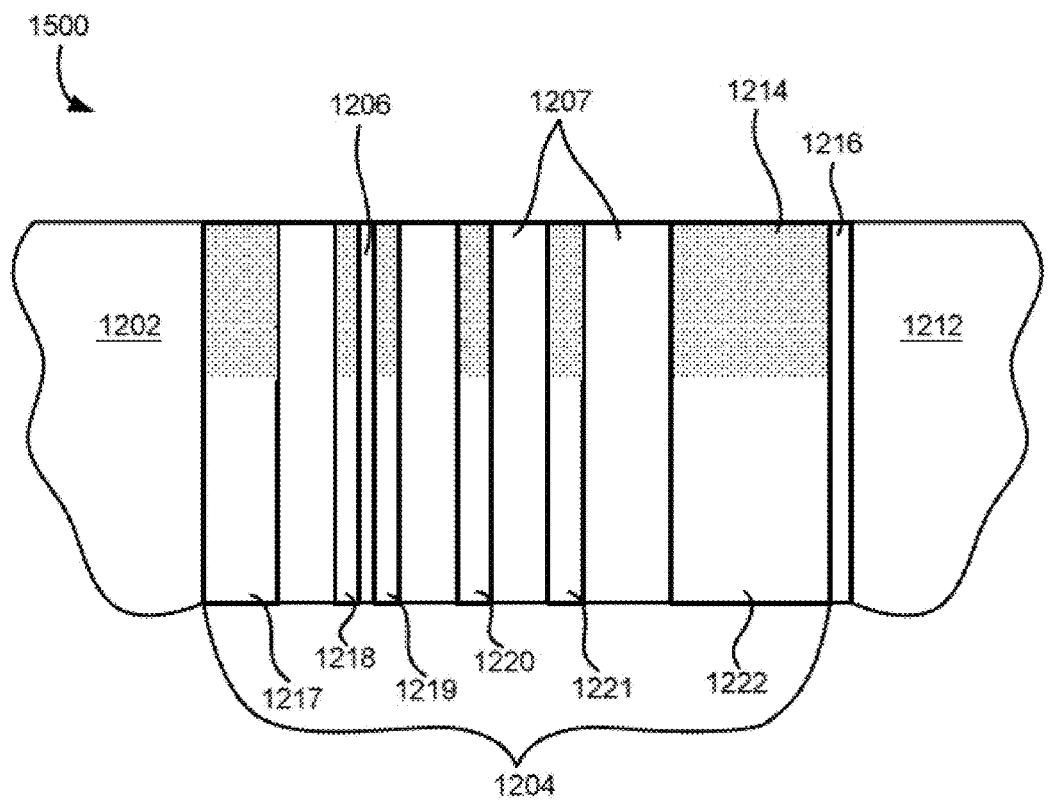
FIG. 15 is a partial cross-sectional view of a magnetic head having crystallization, in accordance with an embodiment of the present disclosure.

FIG. 15 depicts a magnetic head 1500, in accordance with an embodiment of the present disclosure. As an option, the present magnetic head 1500 can be implemented in conjunction with features from any other embodiment listed herein, such as those described with reference to the other FIGS. Of course, however, such magnetic head 1500 and others presented herein can be used in various applications and/or in permutations which may or may not be specifically described in the illustrative embodiments listed herein. Further, the magnetic head 1500 presented herein can be used in any desired environment.

In yet another alternate embodiment, a magnetic head 1500, as depicted in FIG. 15, where the thin films 1204 may be proximate to the plane of the media facing side of the substrate 1202. In various approaches, at least one, more than one, a majority, etc. of the thin films 1204 may be proximate to the plane of the media facing side of the substrate 1202.

Figure 16:
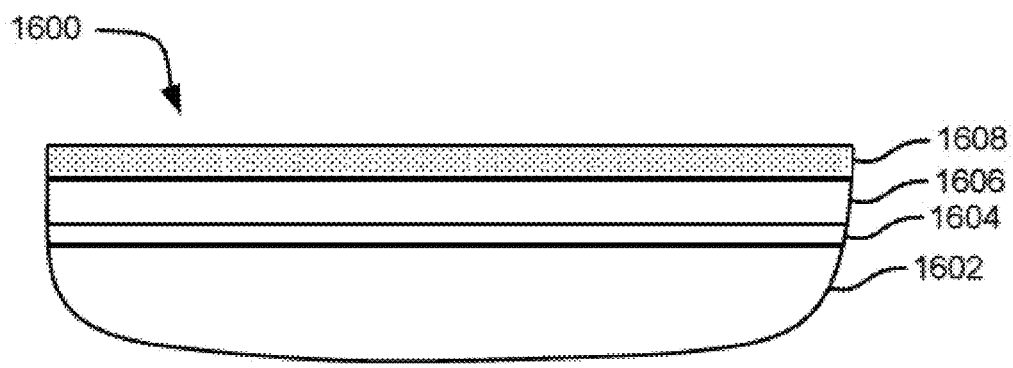
FIG. 16 is a partial cross-sectional view of a structure with a chromium oxide layer having crystallization, in accordance with an embodiment of the present disclosure.

FIG. 16 depicts a structure 1600 formed according to the method described above. As an option, the present structure 1600 may be implemented in conjunction with features from any other embodiment listed herein, such as those described with reference to the other FIGS. Of course, however, such structure 1600 and others presented herein may be used in various applications and/or in permutations which may or may not be specifically described in the illustrative embodiments listed herein. Further, the structure 1600 presented herein may be used in any desired environment.

With continued reference to FIG. 16, the structure includes a substrate 1602, optionally one or more thin films 1604, 1606, and a chromium oxide layer 1608 processed as above.

This approach may be used in any type of application. For example, the at least partially crystalline chromium oxide layer 1608 may be used as a hardened seed layer, upon which another layer may be grown. Such subsequently-formed layer may grow under the influence of the crystallized chromium oxide seed layer. Thus, in some approaches, a second layer may be formed on the seed layer, the second layer having epitaxial growth on the seed layer.

Figure 17:
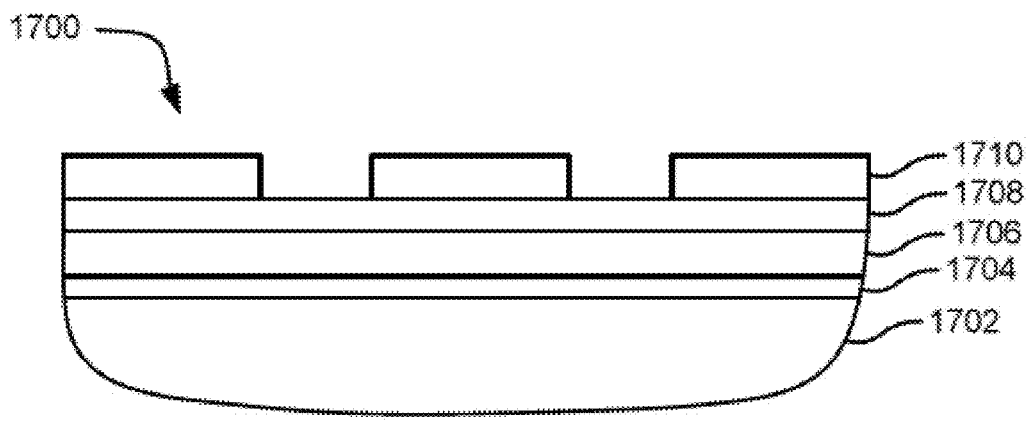
FIG. 17 is a partial cross-sectional view of a masked structure with a chromium oxide layer, in accordance with an embodiment of the present disclosure.
Figure 18:
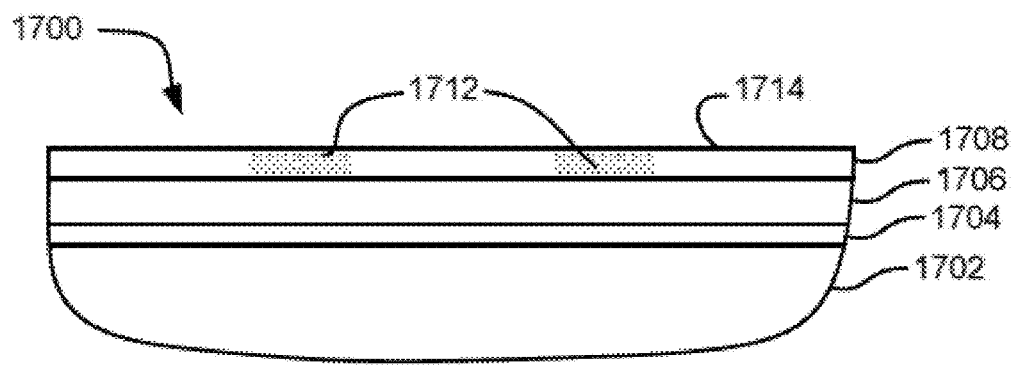
FIG. 18 is a partial cross-sectional view of the structure of FIG. 17 after exposure of the chromium oxide layer.

Referring to FIG. 17, which shows a structure 1700 having a substrate 1702, optionally one or more thin films 1704, 1706, and a chromium oxide layer 1708, if only a portion of the chromium oxide layer is to be exposed, a process according to one embodiment may include the following steps. A mask 1710 may be formed above the chromium oxide layer 1708, the mask defining exposed and unexposed regions of the chromium oxide layer 1708. The exposing is performed after the forming the mask 1710 for converting the amorphous and/or partially polycrystalline component of the chromium oxide layer in the exposed regions to the crystalline state. The unexposed regions of the chromium oxide layer are masked from the exposing, thereby creating a pattern of crystalline regions 1712 immediately adjacent amorphous and/or partially polycrystalline portions 1714, as depicted in FIG. 18, even when the chromium oxide layer 1708 is initially of uniform chemical composition throughout. The character of the beam of charged particles, the exposing, etc. may generally be as described elsewhere herein.

Figure 19:
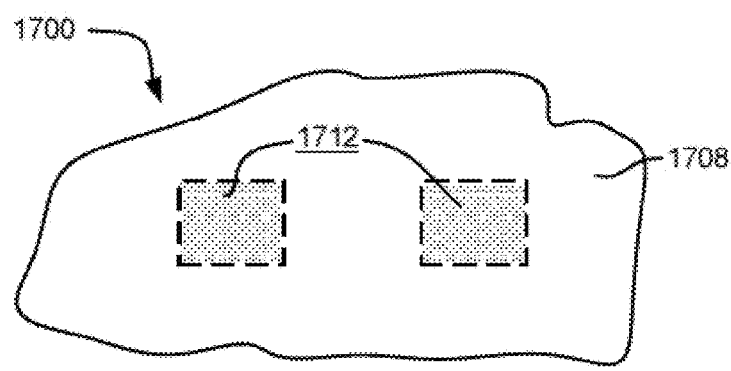
FIG. 19 is a partial top view of the structure of FIG. 18.

The masking may be performed in any desired shape, as would be understood by one skilled in the art upon reading the present description. FIG. 19 depicts an illustrative pattern of crystalline regions 1712 in the chromium oxide layer 1708 of the structure 1700 of FIG. 19.

As an option, the present structure 1700 may be implemented in conjunction with features from any other embodiment listed herein, such as those described with reference to the other FIGS. Of course, however, such structure 1700 and others presented herein may be used in various applications and/or in permutations which may or may not be specifically described in the illustrative embodiments listed herein. Further, the structure 1700 presented herein may be used in any desired environment.

Figure 20:
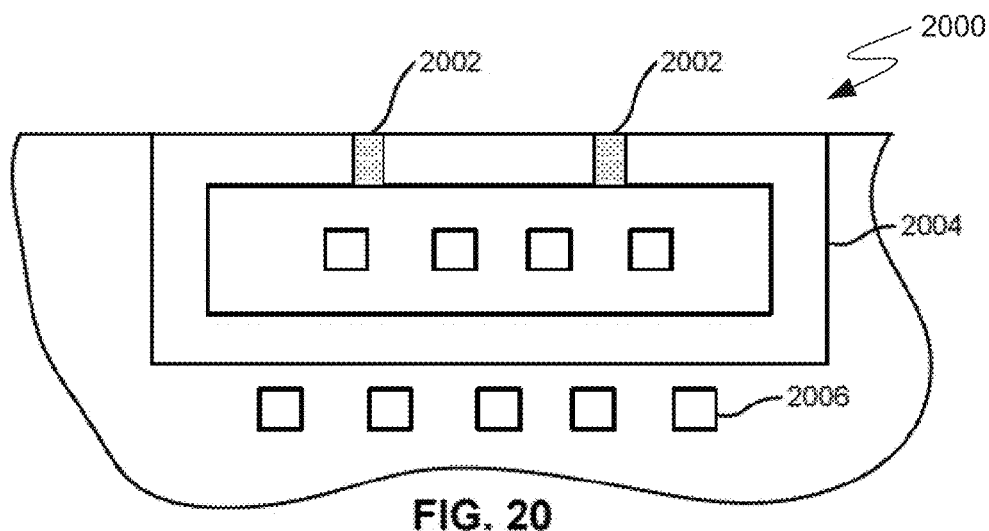
FIG. 20 is a partial cross-sectional view of a servo patter writer, in accordance with an embodiment of the present disclosure.

FIG. 20 illustrates a servo pattern writer 2000 according to one exemplary embodiment. As an option, the present structure 2000 may be implemented in conjunction with features from any other embodiment listed herein, such as those described with reference to the other FIGS. Of course, however, such structure 2000 and others presented herein may be used in various applications and/or in permutations which may or may not be specifically described in the illustrative embodiments listed herein. Further, the structure 2000 presented herein may be used in any desired environment.

With continued reference to FIG. 20, the servo pattern writer 2000 has write gaps 2002 in a yoke 2004 of conventional materials and design. Coils 2006 of conventional construction are also present. The gaps 2002 are formed of a crystalline chromium oxide created as described herein.

Figure 21:
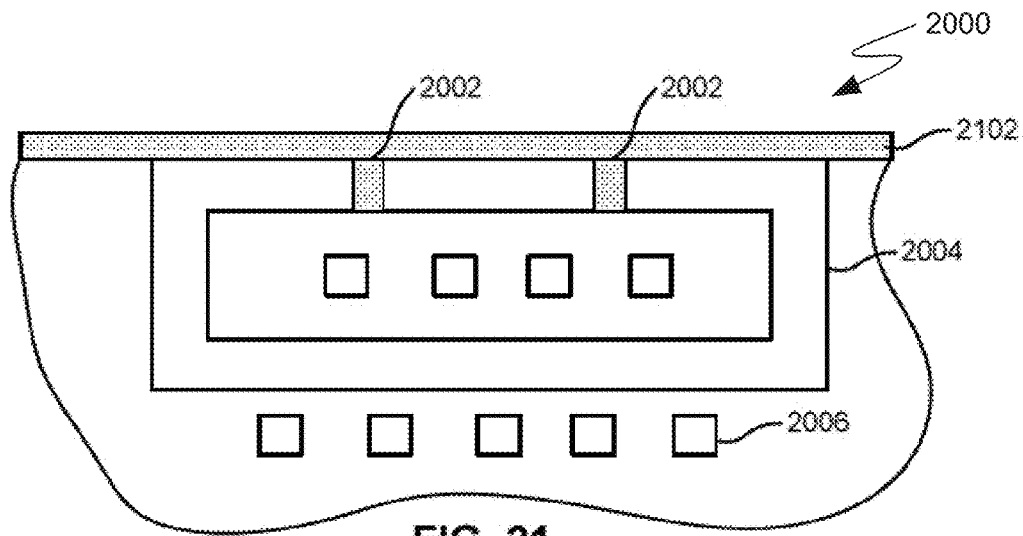
FIG. 21 is a partial cross-sectional view of the servo patter writer of FIG. 20 with an additional layer, in accordance with an embodiment of the present disclosure.

As an option, as shown in FIG. 21, a second chromium oxide layer 2102 may be formed on the servo pattern writer 2000 of FIG. 20, and exposed to convert an amorphous or partially polycrystalline portion of the second chromium oxide layer 2102 to a crystalline state.

In one embodiment, a data storage system may include a magnetic head according to any of the approaches described and/or suggested herein.

The data storage system may further include a drive mechanism for passing a magnetic medium over the magnetic head.

Furthermore, the data storage system may incorporate a controller electrically coupled to the magnetic head. According to various approaches, the controller may be electrically coupled to the magnetic head via a wire, a cable, wirelessly, etc.

The embodiments described and/or alluded to herein provide a means of increasing the wear resistance of existing head films, while including chromium oxide films in the gap. Some of the aforementioned embodiments may also provide increased wear resistance without increasing the head-media separation.

It will be clear that the various features of the foregoing methodologies may be combined in any way, creating a plurality of combinations from the descriptions presented above.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method, comprising:
   depositing a plurality of layers to form, at least in part, a tape head, wherein:
   a chromium oxide component is a chromium oxide layer that is included in the plurality of layers;
   the plurality of layers includes at least one nickel-iron shield formed therein;
   the plurality of layers includes at least one transducer formed therein; and
   the at least one transducer includes at least one of a sensor and a writer;
   depositing the chromium oxide layer onto the nickel-iron shield, wherein the deposited oxide layer is partially polycrystalline; and
   exposing a media facing side of the chromium oxide component to an electron beam having an accelerating voltage of at least 100 kilovolts to crystallize at least a portion of the chromium oxide component.

2. The method of claim 1, wherein exposing the chromium oxide component to the electron beam increases the hardness of the chromium oxide component to at least 12 gigapascals.

3. The method of claim 1, wherein exposing the chromium oxide component to the electron beam increases the hardness of the chromium oxide component by at least twenty percent.

4. The method of claim 1, wherein the chromium oxide layer is positioned between the transducer and the nickel-iron shield.

5. The method of claim 1, further comprising:
   depositing a chromium oxide overcoat on a media facing side of the plurality of layers that form, at least in part, the tape head; and
   exposing at least a portion of the overcoat to the electron beam to further crystallize, at least in part, a partially polycrystalline portion of the overcoat.

6. The method of claim 1, further comprising:
   depositing a chromium oxide overcoat on a media facing side of the plurality of layers that form, at least in part, the tape head; and
   exposing at least a portion of the overcoat to electron beam to crystallize, at least in part, an amorphous portion of the overcoat, wherein the electron beam has an accelerating voltage of more than 100 kilovolts.

7. The method of claim 6, further comprising:
   crystallizing at least one layer of the plurality of layers to a depth below the overcoat.

8. The method of claim 1, wherein the electron beam has an accelerating voltage of more than 100 kilovolts to crystallize, at least in part, an amorphous portion of the chromium oxide component.

9. The method of claim 1, wherein the electron beam is rastered across the media facing side of the chromium oxide component.

\* \* \* \* \*